(12) United States Patent
Ylilammi

(10) Patent No.: US 6,515,558 B1
(45) Date of Patent: Feb. 4, 2003

(54) THIN-FILM BULK ACOUSTIC RESONATOR WITH ENHANCED POWER HANDLING CAPACITY

(75) Inventor: Markku Antero Ylilammi, Espoo (FI)

(73) Assignee: Nokia Mobile Phones Ltd, Espoo (FI)

( * ) Notice: Subject to any disclaimer, the term of this patent is extended or adjusted under 35 U.S.C. 154(b) by 0 days.

(21) Appl. No.: 09/707,092

(22) Filed: Nov. 6, 2000

(51) Int. Cl.[7] .................................................. H03H 9/00
(52) U.S. Cl. ........................ 333/189; 333/191; 310/364
(58) Field of Search ............................... 333/187, 189, 333/190, 191; 310/324, 364

(56) References Cited

U.S. PATENT DOCUMENTS

| | | | |
|---|---|---|---|
| 5,714,917 A | | 2/1998 | Ella ............................ 332/144 |
| 5,873,154 A | | 2/1999 | Ylilammi et al. .......... 29/25.35 |
| 5,910,756 A | * | 6/1999 | Ella ............................ 333/133 |
| 6,060,818 A | | 5/2000 | Ruby et al. ................. 310/363 |
| 6,081,171 A | * | 6/2000 | Ella ............................ 333/189 |
| 6,087,198 A | * | 6/2000 | Panasik ....................... 438/51 |
| 6,262,637 B1 | * | 7/2001 | Bradley et al. ............. 333/133 |
| 6,278,342 B1 | * | 8/2001 | Ella ............................ 333/189 |
| 6,291,931 B1 | * | 9/2001 | Lakin ......................... 310/364 |

OTHER PUBLICATIONS

"Face-Mounted Piezoelectric Resonators," by W.E. Newell, from *Proceedings of the IEEE*, Jun. 1965, pp. 575–581.

"Acoustic Bulk Wave Composite Resonators," by K.M. Lakin and J.S. Wang, from *Applied Physics Letter*, Feb. 1, 1981, vol. 38, No. 3, pp. 125–127.

"Development of Miniature Filters for Wireless Applications," by K.M. Lakin, G.R. Kline and K.T. McCarron, from *IEEE Transactions on Microwave Theory and Techniques*, Dec. 1995, vol. 43, No. 12, pp. 2933–2939.

"Thin Film ZnO Based Bulk Acoustic Mode Filters," by C. Seabury, P. Kobrin, R. Addison and D. Havens from *IEEE MTT–S Digest*, Jun. 1997, pp. 181–184.

"FBAR Technology Shrinks CDMA Handset Duplexers," by D. McNamara, from *Microwaves & RF*, Sep. 2000, pp. 71–79.

* cited by examiner

*Primary Examiner*—Robert Pascal
*Assistant Examiner*—Dean Takaoka
(74) *Attorney, Agent, or Firm*—Ware, Fressola, Van Der Sluys & Adolphson LLP

(57) ABSTRACT

A filter and a method for fabricating a filter comprising a thin film bulk acoustic wave resonator (FBAR), the FBAR including a plurality of layers of different materials deposited on top of each other and oh top of a substrate, the FBAR including a piezolayer sandwiched between a top electrode on the side of the piezolayer facing away from the substrate, and a bottom electrode on the side of the piezolayer facing the substrate, the FBAR further including an acoustic mirror made from a number of layers of different materials selected to provide in combination high reflectivity of sound energy, the method comprising the step of forming the bottom electrode from a material having a small acoustic impedance. A filter fabricated according to the method is advantageously used as part of a mobile phone, in the transmitter/receiver section of the mobile phone, the transmitter section including a power amplifier used to amplify signals before transmitting the signals via an antenna, and in particular as a component of a transmitter filter, coupling the power amplifier of the transmitter section to the antenna.

13 Claims, 4 Drawing Sheets

THIN-FILM BULK ACOUSTIC RESONATOR WITH ENHANCED POWER HANDLING CAPACITY

FIELD OF THE INVENTION

The present invention relates to resonators. More particularly, the present invention relates to a thin-film bulk acoustic wave resonator.

BACKGROUND OF THE INVENTION

Resonators based on membranes or thin film layers are used to convert sound waves to electric signals, and vice versa. An arriving sound wave exerts a stress on the membrane, straining the membrane. Such resonators are made by depositing the film layers oh a substrate (usually $SiO_2$) by various techniques including sputtering, and include a piezoelectric layer (piezolayer) sandwiched between a top electrode, the layer farthest from the substrate, and a bottom electrode, nearer the substrate. When the membrane (and hence the piezolayer) strain, an electric field is created in the piezolayer. The electric field is sensed as a voltage across the top and bottom electrodes, a voltage correlated to the sound wave. For example, in an article entitled "Acoustic Bulk Wave Composite Resonators", Applied Physics Lett., Vol. 38, No. 3, pp. 125–127, Feb. 1, 1981, by K. M. Lakin and J. S. Wang, an acoustic bulk wave resonator is comprised of a thin film piezoelectric layer of Zinc-Oxide (ZnO) sputtered over a thin membrane of Silicon (Si). The resonator exhibits high acoustic reflectivity characteristics at interfaces between the air and device, therefore enabling the device to have a suitable figure of merit (Q).

To isolate the substrate from the acoustic energy created by the vibrating piezolayer, the prior art teaches using so-called acoustic mirrors, i.e. layers of materials presenting to arriving sound energy an impedance mismatch at the interfaces of the materials. An example of a resonator including an acoustic mirror is disclosed in the article entitled "Ultrasonics in Integrated Electronics", Proc. IEEE, Vol. 53, October 1965, pp. 1305–1309, by W. E. Newell. The acoustic mirror in such a resonator may include a lower layer having a low acoustic impedance and a thickness of one-quarter wavelength, and an upper layer having a high acoustic impedance and a high reflectivity characteristic. In such a device, the lower layer functions as an "impedance converter," since it can transform the acoustic impedance of a substrate to a very low value. In a device where each of the layers has a thickness of one-quarter wavelength, the conversion factor of the pair of layers is equal to the square of the ratio of their respective impedances.

A voltage across the piezolayer, applied via the top and bottom electrodes, creates a mechanical stress and, consequently, an acoustic wave in the FBAR structure. The wave reflects back from the acoustic mirror and from the top air interface. The properties (amplitude and phase) of this wave are modified by the mechanical properties of the thin film stack. The sound oscillates in the thin film stack. At a certain frequency (called the series resonance frequency), there is a resonance condition and the amplitude of the wave becomes large.

The piezoelectricity of the piezolayer also works (transduces) in the opposite direction; a mechanical (acoustic) wave creates an electric voltage across the piezolayer. The mechanical energy to electrical energy transducing allows measuring the acoustic response of a resonator by means of an electrical measurement. In practice, the measured electrical quantity is the electrical impedance (ratio of voltage to current in the piezolayer). Because of the frequency dependence of the electrical impedance (which correlates to the mechanical or acoustic impedance), an FBAR structure is useful as a component of an electrical filter.

Unfortunately, because many layers need to be formed to create these types of devices, it can be difficult to form the layers to have precise "design" thicknesses. Also, during the fabrication of these resonators the process of sputtering the layers often results in the layers having incorrect thicknesses.

A further problem with these types of resonator is associated with intrinsic stress, compressive or tensile stress on a thin film layer created in depositing it on the substrate, i.e. stress on the thin film caused by the deposition process itself. The intrinsic stresses on the layer materials forming the resonators can inevitably strain the lower stack layers, eventually resulting in at least one of these layers being peeled from the substrate. This peeling problem becomes more severe for resonators having thicker layer stacks.

U.S. Pat. No. 5,873,154 to Ylilammi et al. teaches addressing both of the above problems, the thickness problem and the peeling problem, by using one or more low acoustic impedance polymer layers (of e.g. polyimide, so as to be able to withstand the high temperatures used in fabricating the resonator), and using high atomic weight, high acoustic impedance materials, preferably tungsten (W), for each electrode.

Besides the peeling problem associated with (substantially static) intrinsic stress, there is a mechanical strength/peeling problem associated with the high-frequency stress caused by an acoustic wave impinging on the resonator (or being generated by the resonator), a problem that is not addressed by U.S. Pat. No. 5,873,154 to Ylilammi et al. Because of a tendency for the layers to peel as a result of such high-frequency stresses, there is a limitation on the acoustic power that can be generated or received by a thin film resonator. The maximum power (i.e. the power rating) of a resonator is limited both by the mechanical stresses it can endure, as well as by the heat it generates in transducing acoustic energy to electric energy. The prior art teaches proper cooling of a resonator so that mechanical stress, not excessive heating during operation, is the primary limitation on the power rating. The mechanical stresses that can be withstood by a thin film resonator obviously depend on the stack construction, i.e. the particular materials used for the various layers of the resonator and the method of assembling the layers.

What is needed is a stack construction for a thin film resonator with improved capability to withstand mechanical stresses, giving the thin film resonator a higher power rating (when conventional cooling techniques are used in the operation of the resonator).

SUMMARY OF THE INVENTION

Accordingly, the present invention provides a filter and a method for fabricating a filter comprising a thin film bulk acoustic wave resonator (FBAR), the FBAR including a plurality of layers of different materials deposited on top of each other and on top of a substrate, the FBAR including a piezolayer sandwiched between a top electrode on the side of the. piezolayer facing away from the substrate, and a bottom electrode on the side of the piezolayer facing the substrate, the FBAR further including an acoustic mirror made from a number of layers of different materials selected to provide in combination high reflectivity of sound energy, the method comprising the step of forming the bottom electrode from a material having a small acoustic impedance.

In a further aspect of the invention, the bottom electrode is made from a material having a specific acoustic impedance of at most approximately 50 Gg/m2s.

In another, further aspect of the invention, the substrate is made from material selected from. the group consisting of glass, silicon dioxide, and gallium arsenide.

In yet even another, further aspect of the invention, the filter is fabricated to be a band-pass type filter.

A filter fabricated according to the method of the present invention is advantageously used as part of a mobile phone, in the transmitter/receiver section of the mobile phone, the transmitter section including a power amplifier used to amplify signals before transmitting the signals via an antenna, and in particular as a component of a transmitter filter, coupling the power amplifier of the transmitter section to the antenna.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

The inventor has discovered that in attempting to increase the power rating of a thin film resonator, a so-called thin film bulk acoustic wave resonator (FBAR), it is advantageous to use for the bottom electrode (the electrode closest to the substrate), a low acoustic impedance material, such as aluminum (Al). In contrast, as mentioned above, U.S. Pat. No. 5,873,154 to Ylilammi et al teaches using high atomic weight, high acoustic impedance materials, preferably tungsten (W), for both electrodes.

Figure 1:
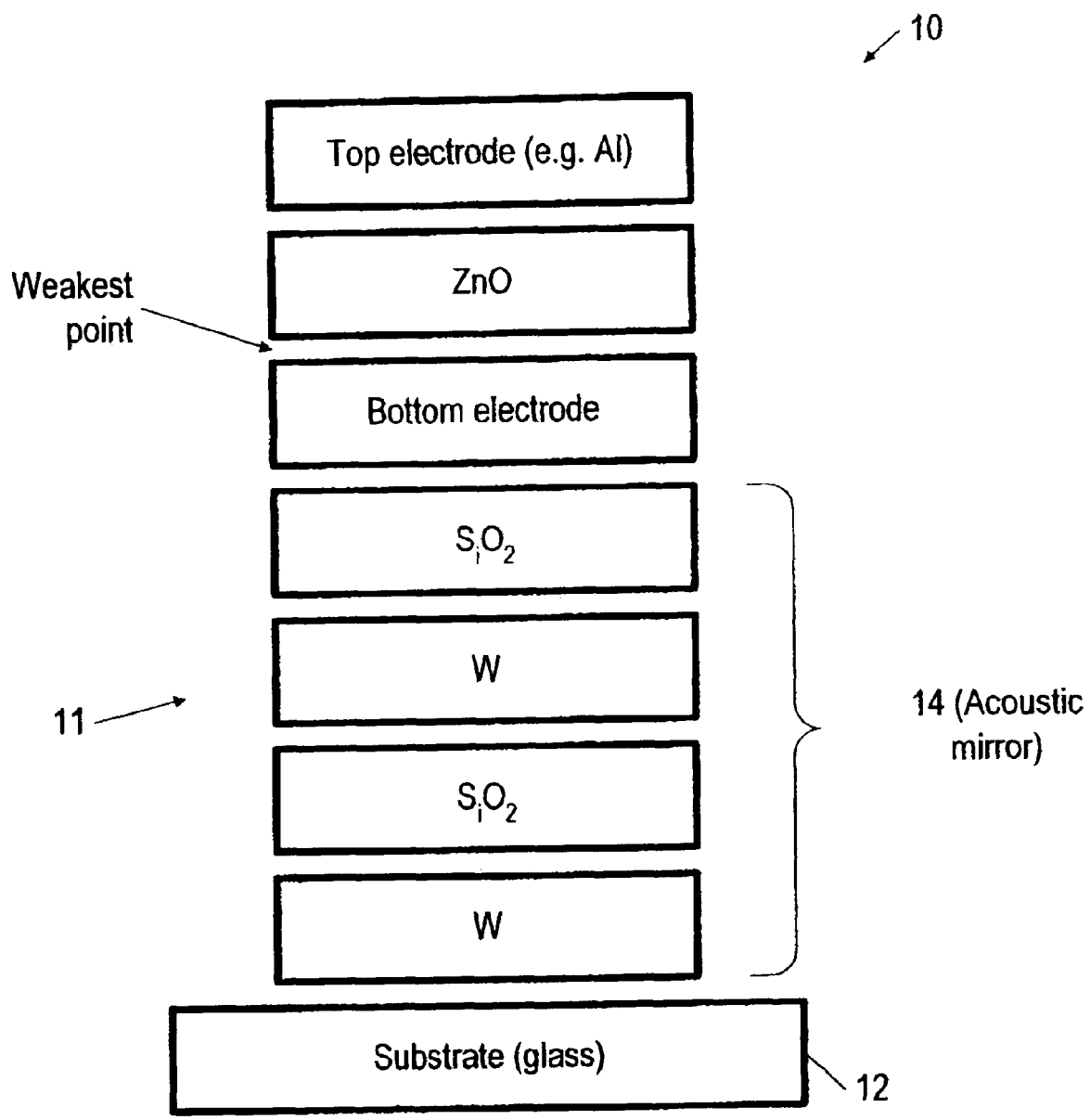
FIG. 1 is a schematic of a schematic of a thin film bulk wave acoustic resonator (FBAR) of a type to which the present invention applies, including a bottom electrode (BE) that would be formed according to the present invention.

Referring now to FIG. 1, one embodiment of a FBAR 10 according to the present invention is shown as including a plurality of layers 11 of different materials deposited on a substrate 12 and on each other. A metallic layer, in this case. made of aluminum (Al), farthestmost from the substrate 12, is referred to as the top electrode. Beneath it, closer to the substrate, is a piezolayer, which in the embodiment shown is zinc oxide (ZnO). Beneath the piezolayer is a so-called bottom electrode (BE), which according to the present invention is a low acoustic impedance (metallic) material such as aluminum.

In this particular embodiment, an acoustic mirror 14 is used to isolate the substrate 12 from the piezolayer of ZnO. In some FBARs, the bottom electrode is part of an acoustic mirror provided with the FBAR, but in the embodiment shown in FIG. 1, the bottom electrode is outside of the acoustic mirror 14. The layers of the acoustic mirror 14 are made from tungsten (W) and silicon dioxide ($SiO_2$). The various interfaces of the acoustic mirror present dramatic changes in acoustic impedance to an incoming acoustic wave, i.e. a sound wave arriving in the direction indicated in FIG. 1, causing substantial reflection of the wave. The same mirror would also reflect sound waves originating in the piezolayer.

There are different ways to isolate the piezolayer from the substrate besides using an acoustic mirror. An air gap is sometimes used instead, in what is called a bridge-type FBAR. One requirement for proper cooling is that there be good heat conduction from the piezolayer to the substrate. The requirement of good heat conduction between the piezolayer and the substrate favors a solid contact, such as is provided by an acoustic mirror, and disfavors an air-gap based FBAR.

Figure 2:
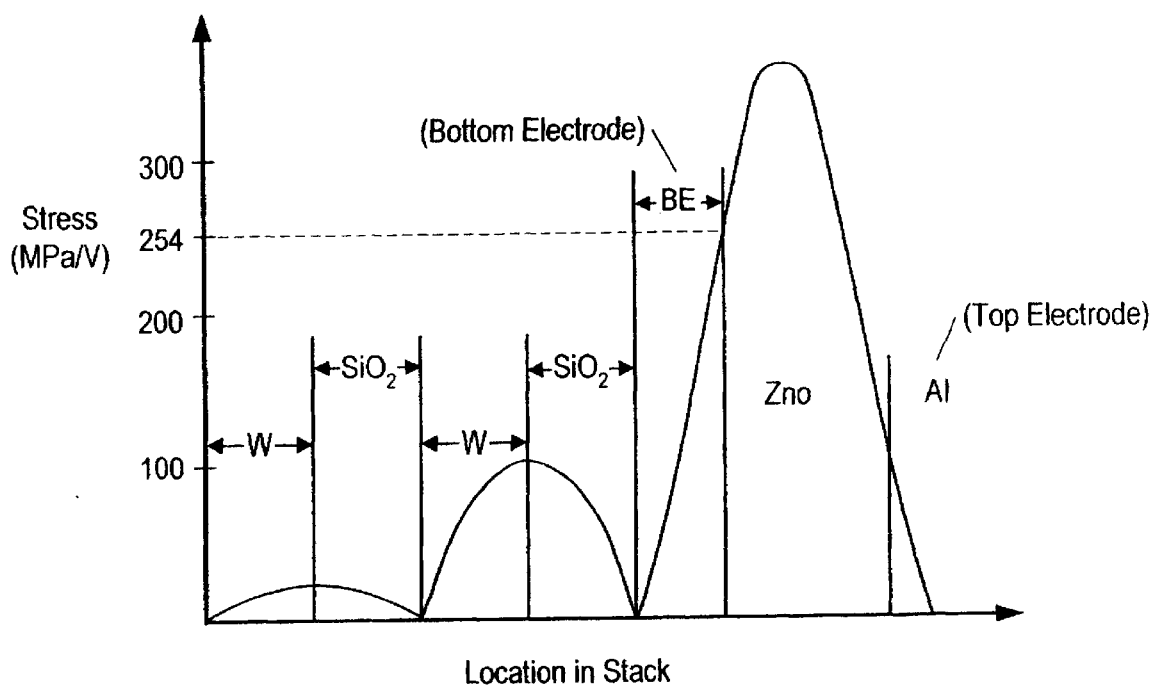
FIG. 2 is a graph indicating stress that occurs in the various layers of an FBAR, and indicating how stress varies within a layer and at the interfaces between layers.

Referring now to FIG. 2, the calculated distribution of mechanical stress inside a FBAR is plotted in case of using a high acoustic impedance, high atomic weight material for the bottom electrode (BE), specifically gold (using aluminum for the top electrode). The plot shows that the stress at the interface between the bottom electrode and the piezolayer of ZnO is 254 MPa/V. The maximum stress is shown to be inside the piezolayer. Because the piezolayer material is strong (being of a crystalline material), it can withstand high stresses and, in practice, the weakest point in a FBAR is on the surface of the bottom electrode at the interface between the bottom electrode and the piezolayer. A high stress there might break the adhesion between the bottom electrode and the piezolayer. Although improved deposition techniques can reduce the tendency for stress to break the adhesion between the BE and the piezolayer, choosing a material to use for the BE is also an approach, one that is to some extent independent of the improved deposition approach.

In choosing a material to use, the inventor has discovered that both the BE/piezolayer interfacial stress and the maximum stress in the piezolayer decrease when a lower acoustic impedance material is used for the bottom electrode.

Figure 3:
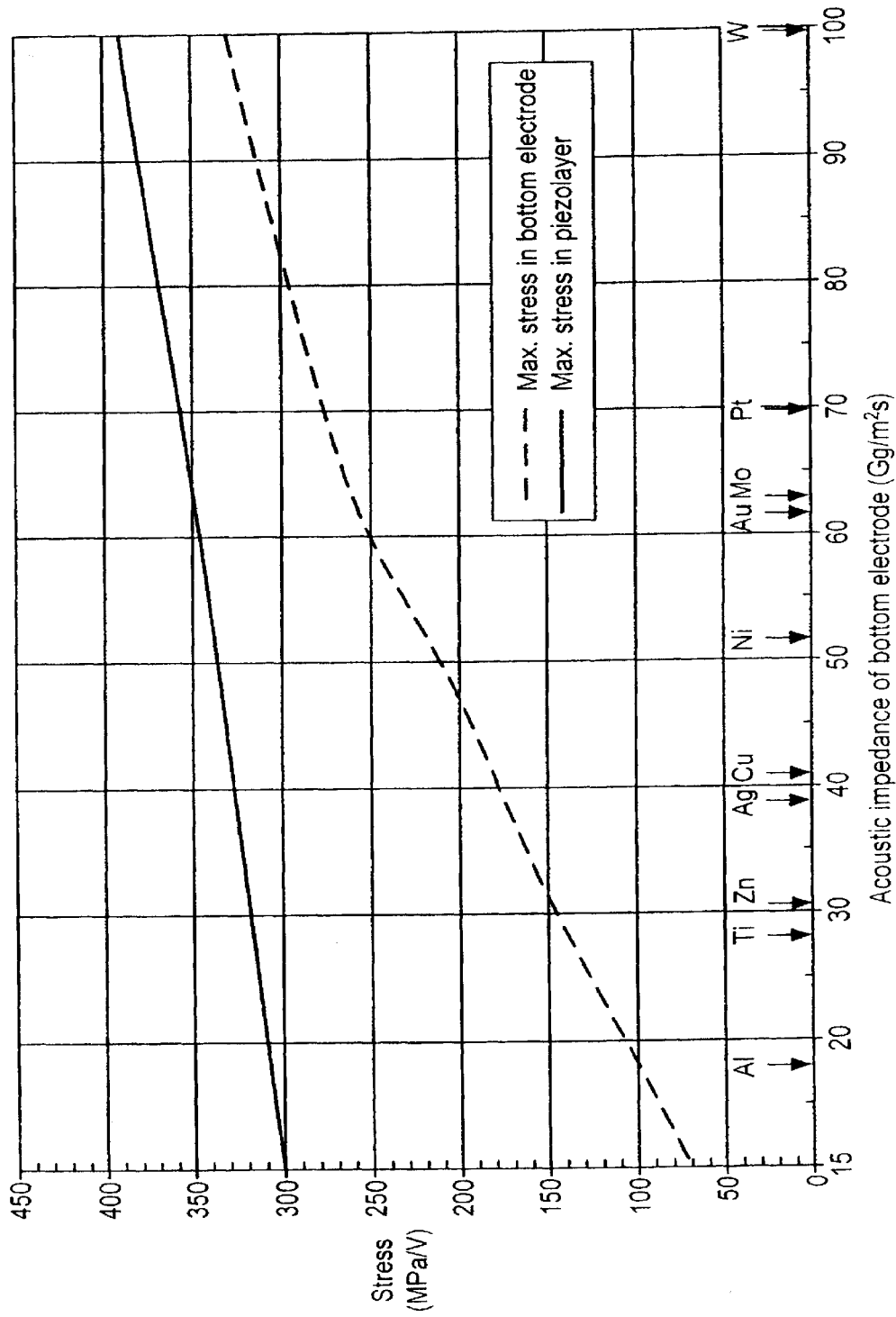
FIG. 3 is a graph indicating maximum stress values, as a function of acoustic impedance, the acoustic impedance being varied by using different materials for the bottom electrode.

Referring now to FIG. 3, a calculation of maximum stress in the piezolayer and at the interface between the piezolayer and the bottom electrode are shown for different values of specific acoustic impedance of the bottom electrode, showing that both the BE/piezolayer interfacial stress and the maximum stress in the piezolayer decrease when a lower acoustic impedance material is used for the bottom electrode.

In particular, because power is proportional to voltage squared, as can be determined from FIG. 3, a change from gold for the bottom electrode to aluminum allows 2.7 times higher voltage or 7 times higher power, provided the maximum allowed stress remains unchanged, i.e. provided the gold/piezolayer adhesion strength is the same as the aluminum/piezolayer adhesion strength. (The value of 2.7 for the ratio of maximum rated voltage for Al as the bottom electrode compared to using Au for the bottom electrode is based on assuming that the limiting factor in rated voltage and hence power is the strength of the interface between the bottom electrode and the piezolayer. From FIG. 3, the maximum stress at the BE/piezolayer interface for Au as the bottom electrode is 254 MPa/V, while for Al as the bottom electrode, the maximum stress is 92 MPa/V. Thus, using Au as the bottom electrode creates 2.7 times as much stress for the same voltage as is created using Al. Therefore, the power handling capacity of the structure is more than seven times as great using Al for the bottom electrode compared to using Au.)

Figure 4A:
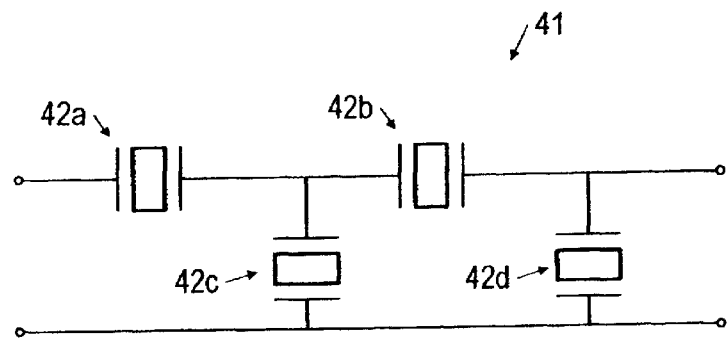
FIG. 4A is a schematic of a filter in which an FBAR according to the present invention can be used.

Referring now to FIG. 4A, a filter 41 is shown including FBARs 42a–42d made suitable for handling high power, according to the present invention. The filter 41 is an example of only one kind of a filter based on FBARs according to the present invention.

Figure 4B:
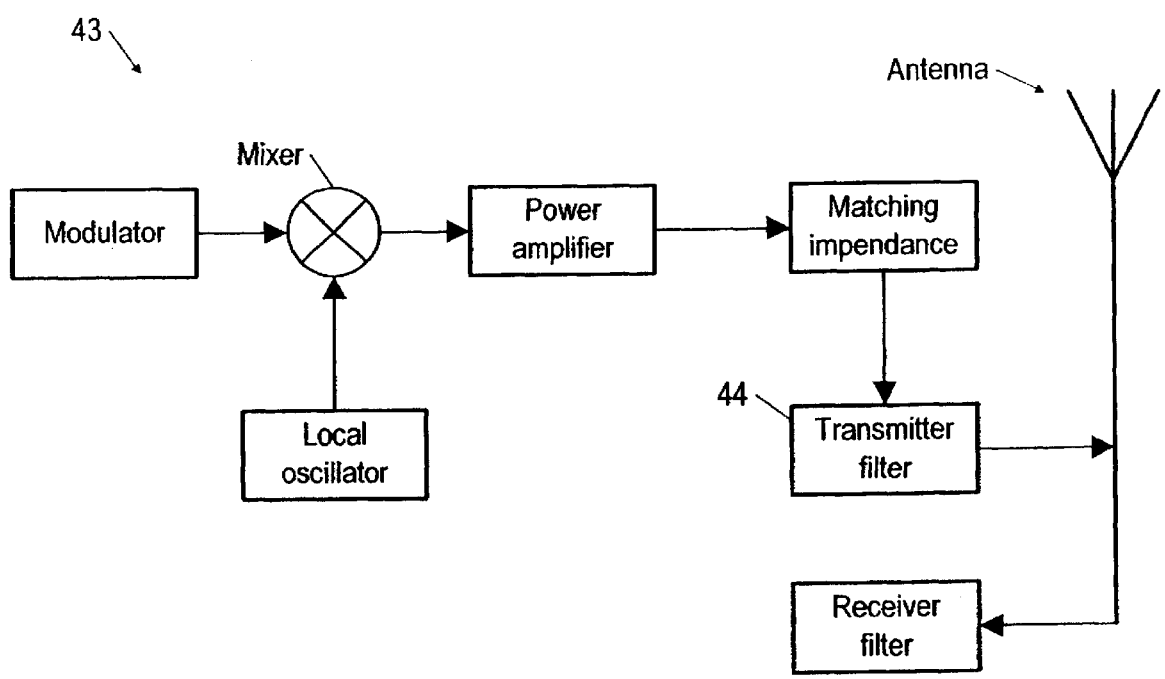
FIG. 4B is a schematic/block diagram of a mobile phone transmitter/receiver section (showing only part of the receiver), including a transmitter in which a filter such as shown in FIG. 4A can be used.

Referring now to FIG. 4B, a typical mobile phone transmitter/receiver section 43 is indicated, showing various of the components of the transmitter and only the receiver filter, including in the transmitter a transmitter filter 44 that is made suitable for handling high power by including a filter, such as the filter 41 of FIG. 4A, which in turn include FBARs made according to the present invention.

It is to be understood that the above-described arrangements are only illustrative of the application of the principles of the present invention. In particular, the present invention is not to be understood to be limited to use with thin-film resonators including an acoustic mirror; the present invention can be used to enhance the power-handling capacity of any type of thin-film resonator. Numerous modifications and alternative arrangements may be devised by those skilled in the art without departing from the spirit and scope of the present invention, and the appended claims are intended to cover such modifications and arrangements.

What is claimed is:

1. A method for fabricating a filter including a thin film bulk acoustic wave resonator (FBAR), the FBAR having a plurality of layers of different materials deposited on top of each other and on top of a substrate, the FBAR including a piezolayer sandwiched between a top electrode on the side of the piezolayer facing away from the substrate, and a bottom electrode on the side of the piezolayer facing the substrate, the FBAR also including an acoustic mirror situated closer to the substrate with a lowest layer in contact with the substrate over the entire surface of the lowest layer facing the substrate, the method characterized by a step of selecting from only among low acoustic impedance materials one or more materials from which to form the bottom electrode, and a step of forming the bottom electrode only from the one or more materials so selected, thereby increasing the power handling capacity of the filter.

2. The method of claim 1, wherein the bottom electrode is made from a material having a specific acoustic impedance of at most approximately 50 Gg/m²s.

3. The method of claim 1, wherein the substrate is made from material selected from the group consisting of glass, silicon dioxide, and gallium arsenide.

4. The method of claim 1, wherein the filter is fabricated to be a band-pass type filter.

5. The method of claim 4, wherein the filter is fabricated so as to comprise at least four FBARs.

6. A filter, including a thin film bulk acoustic wave resonator (FBAR) made according to the method of claim 1.

7. The filter of claim 6, wherein the bottom electrode is made from a material having a specific acoustic impedance of at most approximately 50 Gg/m²s.

8. The filter of claim 6, wherein the substrate is made from material selected from the group consisting of glass, silicon dioxide, and gallium arsenide.

9. The filter of claim 6, wherein the filter is a band-pass type filter.

10. The filter of claim 9, wherein the filter comprises at least four FBARs.

11. The filter of claim 10, wherein the filter is used as part of a transmitter in a mobile phone, the mobile phone including an antenna and including a power amplifier, the filter coupling the power amplifier to the antenna.

12. The filter of claim 11, wherein the-filter is a band-pass type filter.

13. The filter of claim 12, wherein the filter comprises at least four FBARs.

* * * * *

UNITED STATES PATENT AND TRADEMARK OFFICE
CERTIFICATE OF CORRECTION

PATENT NO.    : 6,515,558 B1                                               Page 1 of 1
DATED         : February 4, 2003
INVENTOR(S)   : Markku Antero Ylilammi It is certified that error appears in the above-identified patent and that said Letters Patent is hereby corrected as shown below:

<u>Title page,</u>
Item [57], ABSTRACT,
Line 6, "other and oh top of a substrate" should be -- other and on top of a substrate --.

<u>Column 1,</u>
Line 17, "the film layers oh a substrate" should be -- the film layers on a substrate --.

<u>Column 2,</u>
Line 65, "of the. piezolayer facing" should be -- of the piezolayer facing --.

<u>Column 3,</u>
Line 10, "selected from. the group" should be -- selected from the group --.
Line 63, "in this case." should be -- in this case --.

<u>Column 6,</u>
Line 36, "wherein the-filter is" should be -- wherein the filter is --.

Signed and Sealed this

Twenty-fifth Day of March, 2003

JAMES E. ROGAN
*Director of the United States Patent and Trademark Office*